United States Patent
Lee (10) Patent No.: US 8,493,809 B2
(45) Date of Patent: Jul. 23, 2013

(54) REFRESH CONTROL CIRCUIT AND SEMICONDUCTOR MEMORY APPARATUS USING THE SAME

(75) Inventor: Ki Hoon Lee, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 317 days.

(21) Appl. No.: 12/958,233

(22) Filed: Dec. 1, 2010

(65) Prior Publication Data

US 2012/0051169 A1    Mar. 1, 2012

(30) Foreign Application Priority Data

Aug. 30, 2010    (KR) .................. 10-2010-0083988

(51) Int. Cl.
*G11C 11/406* (2006.01)
*G11C 8/12* (2006.01)

(52) U.S. Cl.
USPC ...... 365/222; 365/230.03; 365/201; 365/195; 365/225.7

(58) Field of Classification Search
USPC .................. 365/222, 230.03, 201, 195, 225.7
See application file for complete search history.

(56) References Cited

U.S. PATENT DOCUMENTS

| 6,590,822 B2 | 7/2003 | Hwang et al. | |
|---|---|---|---|
| 6,992,943 B2 | 1/2006 | Hwang et al. | |
| 2004/0156249 A1* | 8/2004 | Kim .............................. | 365/200 |
| 2008/0049532 A1* | 2/2008 | Kajigaya ...................... | 365/222 |

FOREIGN PATENT DOCUMENTS

| JP | 2002-334576 | 11/2002 |
|---|---|---|
| JP | 2009-059452 | 3/2009 |
| KR | 1020030001710 A | 1/2003 |
| KR | 1020050106828 A | 11/2005 |
| KR | 100809960 B1 | 2/2008 |
| KR | 1020110134634 A | 12/2011 |

* cited by examiner

*Primary Examiner* — J. H. Hur
(74) *Attorney, Agent, or Firm* — William Park & Associates Patent Ltd.

(57) ABSTRACT

A refresh control circuit is capable of activating a plurality of bank selection signals in response to a refresh command signal. Each of the plurality of bank selection signals is assigned to one of a plurality of bank groups. The refresh control circuit is configured to activate the plurality of bank selection signals when a refresh cycle selection signal is deactivated, and activate a part of the plurality of bank selection signals when the refresh cycle selection signal is activated.

18 Claims, 6 Drawing Sheets

REFRESH CONTROL CIRCUIT AND SEMICONDUCTOR MEMORY APPARATUS USING THE SAME

The present application claims priority under 35 U.S.C. §119(a) to Korean Application No. 10-2010-0083988, filed on Aug. 30, 2010, in the Korean Intellectual Property Office, which is incorporated herein by reference in its entirety as if set forth in full.

BACKGROUND

1. Technical Field

The present invention relates to a semiconductor memory apparatus, and more particularly, to a semiconductor memory apparatus having an improved refresh capability.

2. Related Art

A DRAM (dynamic random access memory) is a typical volatile memory device for a semiconductor memory apparatus. A single memory cell in DRAM includes a cell transistor and a cell capacitor. The cell transistor controls access to the cell capacitor, and the cell capacitor stores charge in response to the data. That is, data is identified as high level data and low level data according to the amount of charge stored in the cell capacitor.

Meanwhile, since charge is introduced to or discharged from the cell capacitor through a leakage current in the memory cell of DRAM, it is necessary to periodically store the stored data. Such a periodic operation for accurately maintaining data is called a refresh operation.

DRAM typically performs refresh operations 4K or 8K times per 64 ms, and such refresh cycles are fixed. A memory unit of DRAM is divided into a plurality of memory banks and the refresh operation is typically simultaneously performed for all memory banks. Therefore, since a very large peak current is generated when all memory banks are simultaneously activated during the refresh operation, instantaneous power consumption is very large which may cause problems in operation stability due to the excessive peak current.

SUMMARY

In one aspect of the present invention, a refresh control circuit activates a plurality of bank selection signals in response to a refresh command signal. Each of the plurality of bank selection signals is assigned to one of a plurality of bank groups. The refresh control circuit is configured to activate the plurality of bank selection signals when a refresh cycle selection signal is deactivated, and activate a part of the plurality of bank selection signals when the refresh cycle selection signal is activated.

In another aspect of the present invention, a semiconductor memory apparatus includes: an address counting unit configured to count a predetermined address range when a refresh command signal is applied to output a plurality of refresh address signals corresponding to values obtained by counting the address range, and configured to output a counting flag signal which is toggled when an address range is started; and a refresh control unit that activates a plurality of bank selection signals in response to the refresh command signal. Each of the plurality of bank selection signals is assigned to one of a plurality of bank groups. The refresh control unit is configured to activate the plurality of bank selection signals when a refresh cycle selection signal is deactivated, and a part of the plurality of bank selection signals when the refresh cycle selection signal is activated. The part of the plurality of bank selection signals belong to one of the plurality of bank groups.

In another aspect of the present invention, a semiconductor memory apparatus includes a plurality of semiconductor memory chips having a refresh cycle adjusted under the control of a refresh cycle signal, wherein each of the plurality of semiconductor memory chips includes: an address counting unit configured to count a predetermined address range when a refresh command signal is applied to output a plurality of refresh address signals corresponding to values obtained by counting the address range, and configured to output a counting flag signal which is toggled when the address range is started; and a refresh control unit that activates a plurality of bank selection signals in response to the refresh command signal. Each of the plurality of bank selection signals is assigned to one of a plurality of bank groups. The refresh control unit is configured to activate the plurality of bank selection signals when a refresh cycle selection signal is deactivated, and a part of the plurality of bank selection signals when the refresh cycle selection signal is activated. The part of the plurality of bank selection signals belong to one of the plurality of bank groups.

BRIEF DESCRIPTION OF THE DRAWINGS

Features, aspects, and embodiments are described in conjunction with the attached drawings, in which.

DETAILED DESCRIPTION

Reference will now be made in detail to the exemplary embodiments consistent with the present disclosure, examples of which are illustrated in the accompanying drawings. When possible, the same reference numerals will be used throughout the drawings to refer to the same or like parts. While terms, symbols and signs that are used in drawings and in this detailed description to designate devices, blocks, and so on may be used for detailed units as the occasion demands, it is to be noted that the same terms, symbols and signs may not designate the same devices, blocks, and so on in an entire circuitry. In general, the logic signals of a circuit and binary data values are divided into a high level (H) or a low level (L) in correspondence to voltage levels and may be represented as '1' and '0'. Furthermore, as the occasion demands, a high impedance state (a high-Z state) may be defined and described.

Figure 1:
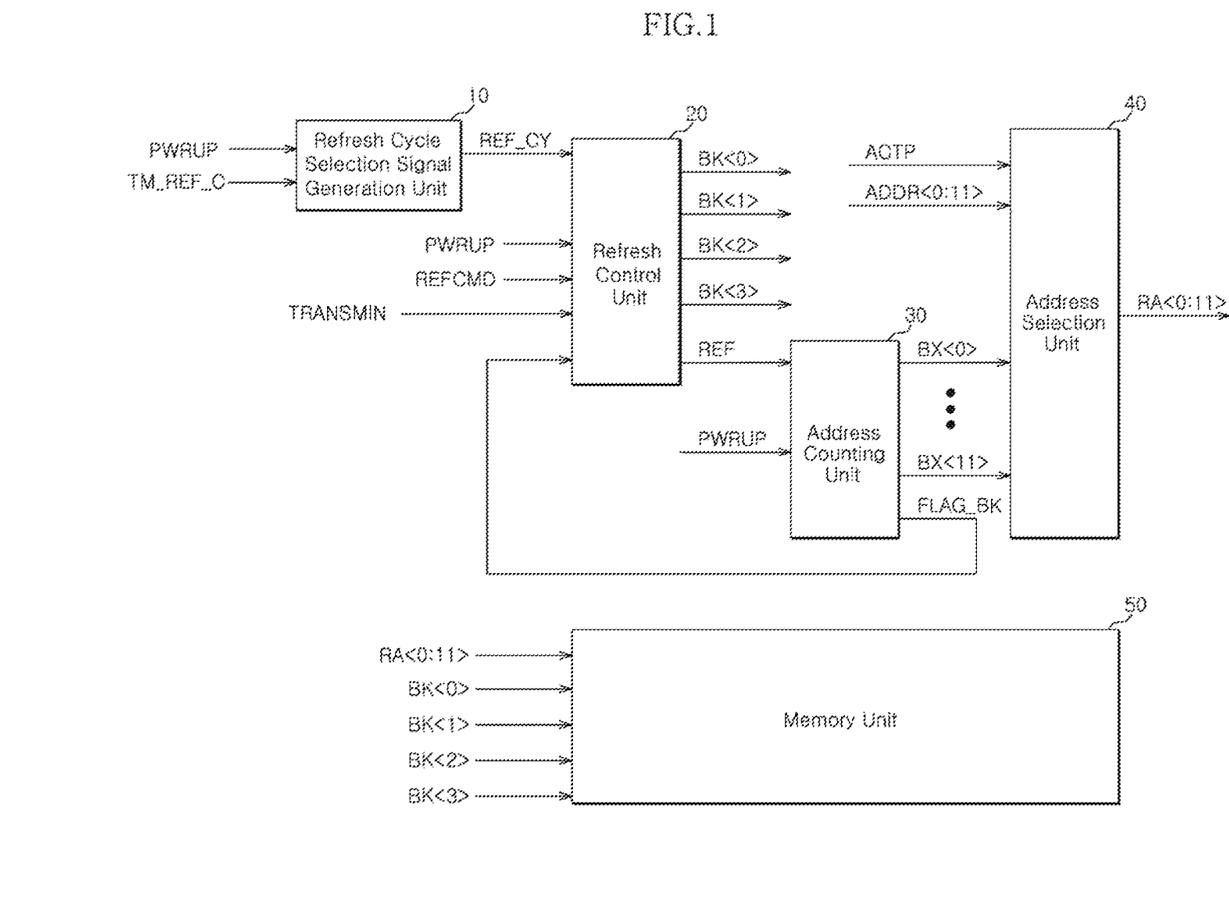
FIG. 1 is a configuration diagram of a semiconductor memory apparatus according to one embodiment.

FIG. 1 is a configuration diagram of a semiconductor memory apparatus according to an embodiment of the present invention.

The semiconductor memory apparatus according to the embodiment includes only a simplified configuration for the sake of clear description of the technical concept suggested by the embodiment.

Referring to FIG. 1, the semiconductor memory apparatus includes a refresh cycle selection signal generation unit 10, a refresh control unit 20, an address counting unit 30, an address selection unit 40, and a memory unit 50. The refresh cycle selection signal generation unit 10 and the address selection unit 40 may be selectively provided according to embodiments. It is assumed that, while not limited thereto, the memory unit 50 includes four memory banks, and the memory banks perform a refresh operation when they are selected by a bank selection signal.

The detailed configuration and principal operations of the semiconductor memory apparatus configured as mentioned above are described below.

The refresh cycle selection signal generation unit 10 is configured to output a refresh cycle selection signal REF_CY which is selectively activated in response to an electrical connection state of a fuse or a test signal TM_REF_C. When a power up signal PWRUP indicating power stabilization is activated, the refresh cycle selection signal generation unit 10 determines whether to activate the refresh cycle selection signal REF_CY according to the electrical connection state of the fuse provided therein. When the test signal TM_REF_C is activated, the refresh cycle selection signal generation unit 10 is activates and outputs the refresh cycle selection signal REF_CY. In one embodiment, the refresh cycle selection signal REF_CY is defined as a signal for adjusting a refresh cycle.

The address counting unit 30 is configured to count a predetermined address range when a refresh command signal REFCMD is applied, and output a plurality of refresh address signals BX<0:11> corresponding to the counting values. At this time, the address counting unit 30 is configured to output a counting flag signal FLAG_BK which is toggled when an address range is started. That is, the address counting unit 30 is configured to count an entire address range, count the address range again from the beginning, and toggle and output the counting flag signal FLAG_BK when the address range is started again. If the counting flag signal FLAG_BK is maintained at a low level when the address range is initially counted, the counting flag signal FLAG_BK is maintained at a high level from the beginning when the address range is counted afterwards. An address counting sequence may vary depending on embodiments. That is, up counting or down counting may be performed and counting may also be performed in a random sequence. In one embodiment, a refresh pulse signal REF input to the address counting unit 30 is activated for a predetermined duration when the refresh command signal REFCMD is input. When the refresh command signal REFCMD is applied, the address counting unit 30 performs a counting operation.

The refresh control unit 20 is configured to activate a plurality of bank selection signals BK<0> to BK<3> in response to the refresh command signal REFCMD. If the refresh cycle selection signal REF_CY has been activated when the refresh command signal REFCMD is input, the refresh control unit 20 activates the plurality of bank selection signals BK<0> to BK<3> belonging to one of a plurality of bank groups under the control of the counting flag signal FLAG_BK. If the refresh cycle selection signal REF_CY has been deactivated when the refresh command signal REFCMD is input, the refresh control unit 20 activates and outputs the plurality of bank selection signals BK<0> to BK<3>.

In one embodiment, the first bank selection signal BK<0> and the second bank selection signal BK<1> are defined as signals for selecting memory banks of a first bank group, and the third bank selection signal BK<2> and the fourth bank selection signal BK<3> are defined as a signal for selecting memory banks of a second bank group. If the refresh command signal REFCMD is input when the refresh cycle selection signal REF_CY has been activated, the refresh control unit 20 activates and outputs the first and second bank selection signals BK<0> and BK<1> for selecting the first bank group or the third and fourth bank selection signals BK<2> and BK<3> for selecting the second bank group according to the logical levels of the counting flag signal FLAG_BK. If the refresh command signal REFCMD is input when the refresh cycle selection signal REF_CY has been deactivated, the refresh control unit 20 activates and outputs the first to fourth bank selection signals BK<0> to BK<3>.

The refresh pulse signal REF output from the refresh control unit 20 is activated when the refresh command signal REFCMD is activated, and is deactivated when a pulse control signal TRANSMIN is activated. The activation duration of the refresh pulse signal REF is controlled by the activation time point (the pulsing time point) of the pulse control signal TRANSMIN. The pulse control signal TRANSMIN is defined as a signal which is output from a command-related control circuit. The power up signal PWRUP is defined as a signal for enabling or initializing an internal logic of the refresh control unit 20.

The address selection unit 40 is configured to output the plurality of refresh address signals BX<0:11> or a plurality of externally applied address signals ADDR<0:11> as output addresses RA<0:11> in response to an active pulse signal ACTP and the refresh pulse signal REF. That is, if the active pulse signal ACTP is activated, the address selection unit 40 outputs the plurality of address signals ADDR<0:11> as the output addresses RA<0:11>. If the refresh pulse signal REF is activated, the address selection unit 40 outputs the plurality of refresh address signals BX<0:11> as the output addresses RA<0:11>. If it is assumed that the output addresses RA<0:11> corresponding to the plurality of refresh address signals BX<0:11> are output from the address selection unit 40, the memory unit 50 refreshes memory blocks corresponding to the plurality of bank selection signals BK<0> to BK<3> and the plurality of refresh address signals BX<0:11>. At this time, since a refresh address may be defined as a word line address, a plurality of memory cells controlled by a corresponding word line are refreshed.

As described above, the semiconductor memory apparatus according to one embodiment performs the refresh operation according to the first bank group and the second bank group if the refresh cycle selection signal REF_CY is activated. If the refresh cycle selection signal REF_CY is activated, the period in which the refresh command signal REFCMD is applied is further shortened compared to when the refresh cycle selection signal REF_CY has been deactivated. For example, if the refresh cycle selection signal REF_CY is deactivated, all memory banks simultaneously perform the refresh operation. At this time, it is assumed that the refresh operation is performed 4K times per 64 ms. Meanwhile, if the refresh cycle selection signal REF_CY is activated, the first and second memory banks corresponding to the first bank group simultaneously perform the refresh operation, and then the third and fourth memory banks corresponding to the second bank group simultaneously perform the refresh operation. Thus, when the relative frequency of which the refresh command signal REFCMD is doubled, the refresh operation is performed 8K times per 64 ms. When the refresh operation is performed according to the bank groups as described above, peak current is reduced, resulting in the prevention of abnormal operation due to instantaneously excessive current consumption.

Figure 2:
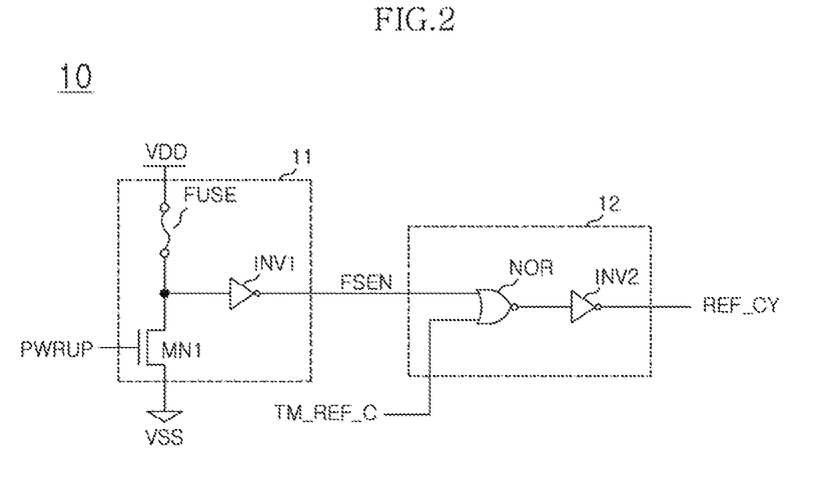
FIG. 2 is a circuit diagram of the refresh cycle selection signal generation unit of FIG. 1 according to one embodiment.

FIG. 2 is a circuit diagram of the refresh cycle selection signal generation unit of FIG. 1 according to one embodiment.

Referring to FIG. 2, the refresh cycle selection signal generation unit 10 includes a fuse state output section 11 and a logic is section 12.

The fuse state output section 11 is configured to output a fuse state signal FSEN with a level corresponding to the electrical connection state of the fuse FUSE in response to the power up signal PWRUP. If the fuse FUSE has been shorted, the fuse state signal FSEN is output at a low level when the power up signal PWRUP is activated. If the fuse FUSE has been opened, the fuse state signal FSEN is output at a high level when the power up signal PWRUP is activated.

The logic section 12 is configured to output the refresh cycle selection signal REF_CY by logically combining the test signal TM_REF_C and the fuse state signal FSEN. In one embodiment, the logic section 12 includes an NORing element NOR and an inverter INV2 which receive the fuse state signal FSEN and the test signal TM_REF_C to output the refresh cycle selection signal REF_CY. When the test signal TM_REF_C is activated to a high level, the logic section 12 outputs the refresh cycle selection signal REF_CY at a high level regardless of the level of the fuse state signal FSEN. If the fuse FUSE has been cut when the test signal TM_REF_C is at a low level, the logic section 12 outputs the refresh cycle selection signal REF_CY at a to high level.

Figure 3:
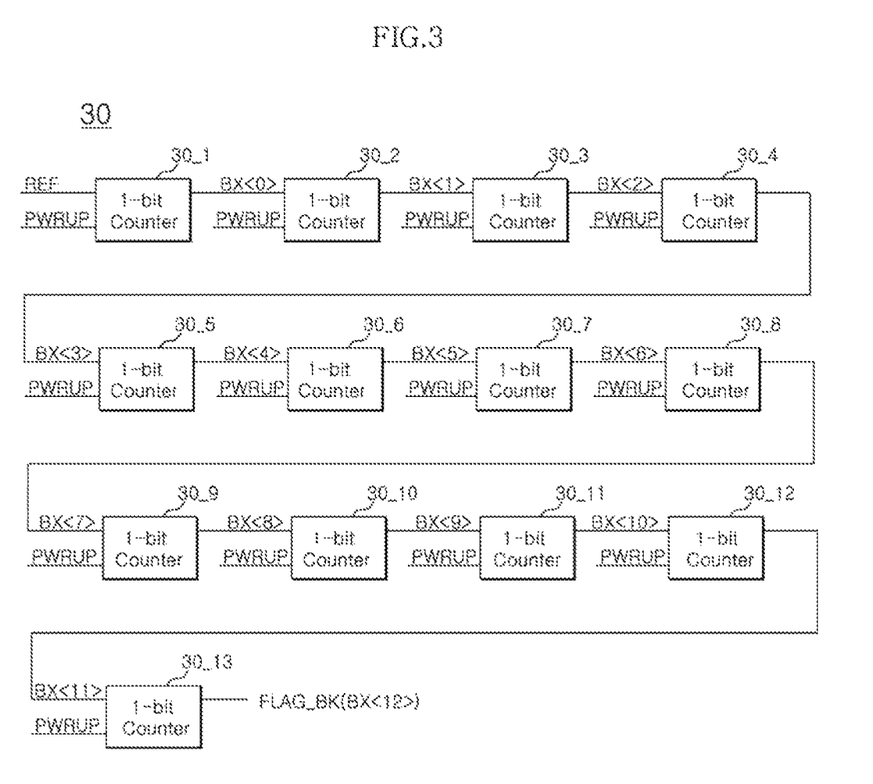
FIG. 3 is a configuration diagram of the address counting unit of FIG. 1 according to one embodiment.

FIG. 3 is a configuration diagram of the address counting unit of FIG. 1 according to one embodiment.

Referring to FIG. 3, the address counting unit 30 includes a plurality of 1-bit counters 30_1 to 30_13 which are serially connected is to one another and initialized under the control of the power up signal PWRUP. In one embodiment, the least significant 1-bit counter 30_13 of the plurality of 1-bit counters 30_1 to 30_13 is configured to output the counting value as the counting flag signal FLAG_BK. If the refresh pulse signal REF pulsed to a high level is input when the refresh command signal REFCMD is applied, the address counting unit 30 performs the counting operation. At this time, after completely counting the predetermined address range, the address counting unit 30 outputs the counting flag signal FLAG_BK at a high level with the start of recounting the address range from the beginning. That is, the refresh address range is counted through the first to twelfth 1-bit counters 30_1 to 30_12, and the least significant thirteenth 1-bit counter 30_13 outputs the counting flag signal FLAG_BK for indicating that the predetermined address range is completely counted and that the address range is to be counted again from the beginning.

Figure 4:
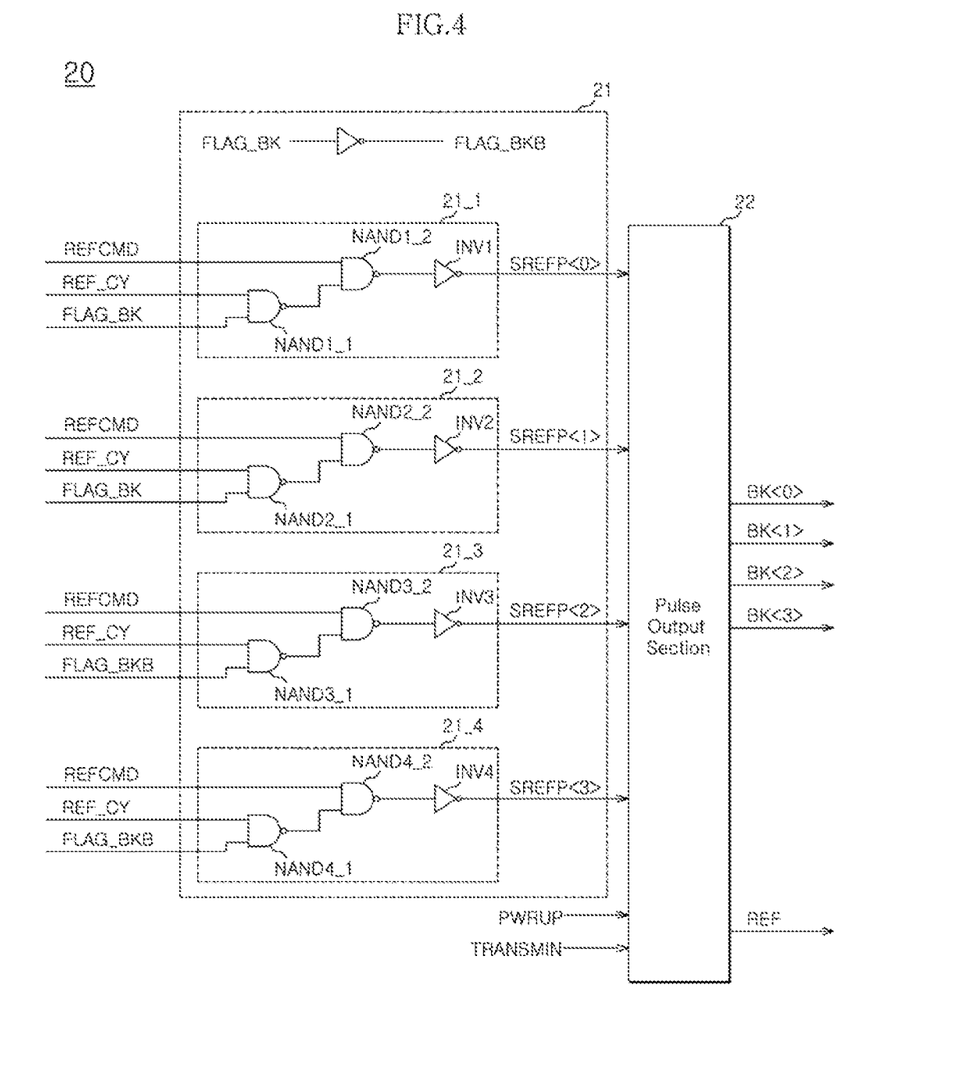
FIG. 4 is a configuration diagram of the refresh control unit of FIG. 1 according to one embodiment.

FIG. 4 is a configuration diagram of the refresh control unit of FIG. 1 according to one embodiment.

Referring to FIG. 4, the refresh control unit 20 includes a control pulse output section 21 and a pulse output section 22. The control pulse output section 21 includes a first control pulse output group and a second control pulse output group. The first control pulse output group includes a first control pulse output part 21_1 and a second control pulse output part 21_2. The second control pulse output group includes a third control pulse output part 21_3 and a fourth control pulse output part 21_4.

The first control pulse output group is configured to output a plurality of first control pulse signals SREFP<0> and SREFP<1> which are selectively activated in response to the refresh command signal REFCMD, the refresh cycle selection signal REF_CY, and the counting flag signal FLAG_BK. In embodiment, the first control pulse output part 21_1 includes a first NANDing element NAND1_1, a second NANDing element NAND1_2, and an inverter INV1. The first NANDing element NAND1_1 is configured to receive the refresh cycle selection signal REF_CY and the counting flag signal FLAG_BK. The second NANDing element NAND1_2 is configured to receive the refresh command signal REFCMD and an output signal of the first NANDing element NAND1_1. The inverter INV1 is configured to receive an output signal of the second NANDing element NAND1_2 and output the first control pulse signal SREFP<0>. The second control pulse output part 21_2 has the same configuration the same as the first control pulse output part 21_1.

The second control pulse output group is configured to output a plurality of second control pulse signals SREFP<2> and SREFP<3> which are selectively activated in response to the refresh command signal REFCMD, the refresh cycle selection signal REF_CY, and an inversion signal FLAG_BKB of the counting flag signal FLAG_BK. In one embodiment, the third control pulse output part 21_3 includes a first NANDing element NAND3_1, a second NANDing element NAND3_2, and an inverter INV3. The first NANDing element NAND3_1 is configured to receive the refresh cycle selection signal REF_CY and the inversion signal FLAG_BKB of the counting flag signal FLAG_BK. The second NANDing element NAND3_2 is configured to receive the refresh command signal REFCMD and an output signal of the first NANDing element NAND3_1. The inverter INV3 is configured to receive an output signal of the second NANDing element NAND3_2 and output the third control pulse signal SREFP<2>. The fourth control pulse output part 21_4 has the same configuration as the third control pulse output part 21_3.

The pulse output section 22 is configured to output the plurality of bank selection signals BK<0> to BK<3>, which are activated corresponding to the activation time points of the plurality of first and second control pulse signals SREFP<0> to SREFP<2>, and the refresh pulse signal REF in response to the power up signal PWRUP and the pulse control signal TRANSMIN. The refresh pulse signal REF is activated at the activation time point of one of the first or second control pulse signals SREFP<0> to SREFP<2>. The plurality of bank selection signals BK<0> to BK<3> and the refresh pulse signal REF are deactivated at the activation time point of the pulse control signal TRANSMIN. The power up signal PWRUP is defined as a signal for initializing or enabling the pulse output section 22.

Figure 5:
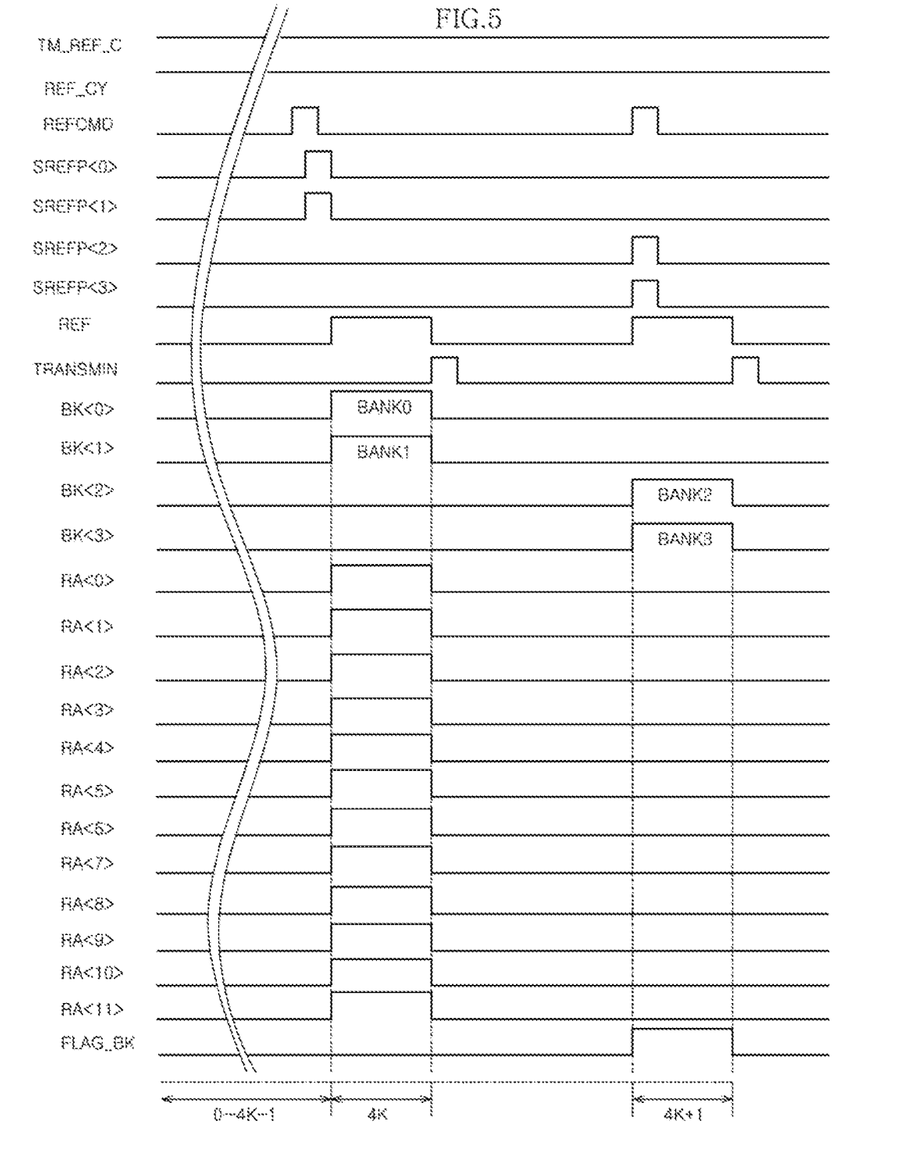
FIG. 5 is a timing diagram illustrating the principal internal operation of a semiconductor memory apparatus according to one embodiment.

FIG. 5 is a timing diagram illustrating the principal internal operation of the semiconductor memory apparatus according to one embodiment.

The principal internal operation of the semiconductor memory apparatus according to one embodiment is described below with reference to the timing diagrams illustrated in FIG. 5 and FIGS. 1 to 4.

The timing diagram illustrated in FIG. 5 shows a part of a process in which the refresh cycle selection signal REF_CY is activated to a high level and the refresh operation is performed according to the bank group to which the bank selection signals belong. It is assumed that an operation, in which the refresh cycle selection signal REF_CY is deactivated to a low level and the first to fourth memory banks BANK0 to BANK3 simultaneously perform the refresh operation with a refresh cycle of 4K per 64 ms, and an operation, in which the refresh cycle selection signal REF_CY is activated to a high level and the first and second banks BANK0 and BANK1 perform the refresh operation (4K−1) times, have been previously performed.

First, since the counting flag signal FLAG_BK has been deactivated to a low level, the $4K^{th}$ refresh operation of the first and second banks BANK0 and BANK1 is performed when the refresh command signal REFCMD is pulsed to a high level.

After the $4K^{th}$ refresh operation of the first and second banks BANK0 and BANK1 is completed, the counting flag signal FLAG_BK is activated to a high level. Consequently, when the refresh command signal REFCMD is pulsed to a high level, the first refresh operation (as a whole, the $(4K+1)^{th}$ refresh operation) of the third and fourth banks BANK2 and BANK3 is performed.

As a result, when the refresh cycle selection signal REF_CY is deactivated to a low level, the refresh operation is performed 4K times per 64 ms. When the refresh cycle selection signal REF_CY is activated to a high level, the refresh operation is performed 8K times per 64 ms.

Figure 6:
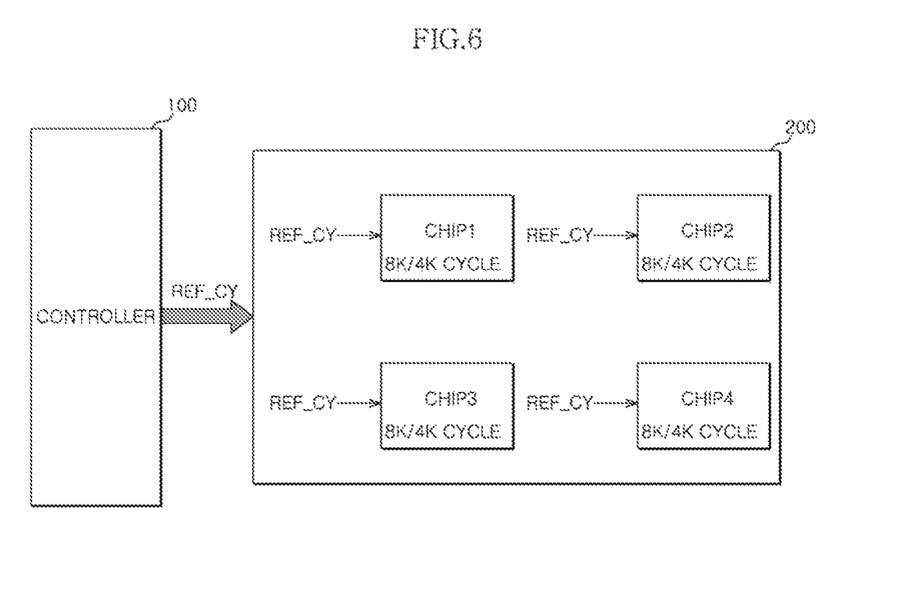
FIG. 6 is a configuration diagram of a semiconductor memory apparatus according to another embodiment.

FIG. 6 is a configuration diagram of a semiconductor memory apparatus according to another embodiment.

Referring to FIG. 6, the semiconductor memory apparatus 200 includes a plurality of semiconductor memory chips CHIP1 to CHIP4. The refresh cycles of the plurality of semiconductor memory chips CHIP1 to CHIP4 are adjusted under the control of the refresh cycle selection signal REF_CY. The plurality of semiconductor memory chips CHIP1 to CHIP4 may be formed in a stacked structure or may also be disposed on the plane of the semiconductor memory apparatus 200 on a single package. The plurality of semiconductor memory chips CHIP1 to CHIP4 may constitute a wide input/output bus WIDE I/O BUS.

Each semiconductor memory chip of the semiconductor memory apparatus 200 has the same circuit as the semiconductor memory apparatus of FIG. 1 according to one embodiment, except that the refresh cycle selection signal REF_CY is applied from an external memory controller 100. Consequently, the refresh cycles of the semiconductor memory chips may be adjusted under the control of the refresh cycle selection signal REF_CY. The refresh cycles of the semiconductor memory chips may be set to be different from one is another.

According to the semiconductor memory apparatus of the embodiments as described above, a plurality of memory banks are activated according to groups, so that the refresh cycle thereof may be adjusted. Furthermore, according to the semiconductor memory apparatus of the embodiments, the refresh cycles of a plurality of semiconductor memory chips may be adjusted under the control of the refresh cycle selection signal.

So far, the embodiment of the present invention has been described in detail. For reference, embodiments including additional component elements, which are not directly associated with the technical concept of the present invention, may be exemplified in order to describe the present invention in further detail. Moreover, an active high configuration or an active low configuration for indicating the activated states of signals and circuits may vary depending upon an embodiment. Furthermore, the configurations of transistors may be changed as the occasion demands in order to realize the same function. Since these embodiment changes have a large number of cases and can be easily inferred by those skilled in the art, the enumeration thereof will be omitted herein.

While certain embodiments have been described above, it will be understood to those skilled in the art that the embodiments described are by way of example only. Accordingly, a block control command generation circuit described herein should not be limited based on the described embodiments. Rather, the block control is command generation circuit described herein should only be limited in light of the claims that follow when taken in conjunction with the above description and accompanying drawings.

What is claimed is:

1. A refresh control circuit for activating a plurality of bank selection signals in response to a refresh command signal, each of the plurality of bank selection signals being assigned to one of a plurality of bank groups,
   wherein the refresh control circuit is configured to activate the plurality of bank selection signals when a refresh cycle selection signal is deactivated, and activate a part of the plurality of bank selection signals when the refresh cycle selection signal is activated,
   wherein the refresh control unit comprises:
   a first control pulse output group configured to output a plurality of first control pulse signals which are selectively activated in response to the refresh command signal, the refresh cycle selection signal, and the counting flag signal;
   a second control pulse output group configured to output a plurality of second control pulse signals which are selectively activated in response to the refresh command signal, the refresh cycle selection signal, and an inversion signal of the counting flag signal; and
   a pulse output section configured to output the plurality of bank selection signals which are activated corresponding to activation time points of each of the plurality of first and second control pulse signals.

2. The refresh control circuit according to claim 1, wherein the part of the plurality of bank selection signals belongs to one of the plurality of bank groups.

3. The refresh control circuit according to claim 2, wherein, when the refresh cycle selection signal is activated, a period in which the refresh command signal is applied is further shortened in comparison to a case where the refresh cycle selection signal has been deactivated.

4. The refresh control circuit according to claim 1, wherein the counting flag signal is toggled when a predetermined address is range is started.

5. A semiconductor memory apparatus comprising:
   an address counting unit configured to count a predetermined address range when a refresh command signal is applied to output a plurality of refresh address signals corresponding to values obtained by counting the address range, and configured to output a counting flag signal which is toggled when the address range is started; and
   a refresh control unit that activates a plurality of bank selection signals in response to the refresh command signal, each of the plurality of bank selection signals being assigned to one of a plurality of bank groups;
   wherein the refresh control unit is configured to activate the plurality of bank selection signals when a refresh cycle selection signal is deactivated, and a part of the plurality of bank selection signals when the refresh cycle selection signal is activated, wherein the part of the plurality of bank selection signals belong to one of the plurality of bank groups,
   wherein the refresh control unit comprises:
   a first control pulse output group configured to output a plurality of first control pulse signals which are selectively activated in response to the refresh command signal, the refresh cycle selection signal, and the counting flag signal;
   a second control pulse output group configured to output a plurality of second control pulse signals which are selectively activated in response to the refresh command signal, the refresh cycle selection signal, and an inversion signal of the counting flag signal; and a pulse output section configured to output the plurality of bank selection signals, which are activated corresponding to activation time points of each of the plurality of first and second control pulse signals, and the refresh pulse signal in response to a power up signal and a pulse control signal.

6. The semiconductor memory apparatus according to claim 5, wherein, when the refresh cycle selection signal is activated, a period in which the refresh command signal is applied is further shortened in comparison to a case where the refresh cycle selection signal has been deactivated.

7. The semiconductor memory apparatus according to claim 5, further comprising a refresh cycle selection signal generation unit that outputs the refresh cycle selection signal which is selectively activated in response to an electrical connection state of a fuse or a test signal.

8. The semiconductor memory apparatus according to claim 7, wherein the refresh cycle selection signal generation unit comprises:

a fuse state output section configured to output a fuse state signal with a level corresponding to the electrical connection state of the fuse in response to a power up signal; and a logic section configured to output the refresh cycle selection signal by logically combining the test signal and the fuse state signal.

9. The semiconductor memory apparatus according to claim 5, further comprising an address selection unit that outputs the plurality of refresh address signals or a plurality of address signals, which are externally applied, as output addresses in response to an active pulse signal and a refresh pulse signal.

10. The semiconductor memory apparatus according to claim 5, wherein the address counting unit includes a plurality of 1-bit counters which are serially connected to one another and initialized under the control of a power up signal, and output the counting flag signal with a level corresponding to a counting value of the least significant 1-bit counter of the plurality of 1-bit counters.

11. The semiconductor memory apparatus according to claim 5, wherein the refresh pulse signal is activated at the activation time point of one of the plurality of first and second control pulse signals.

12. The semiconductor memory apparatus according to claim 11, wherein the plurality of bank selection signals and the refresh is pulse signal are deactivated at an activation time point of the pulse control signal.

13. A semiconductor memory apparatus including a plurality of semiconductor memory chips having a refresh cycle adjusted under the control of a refresh cycle signal, wherein each of the plurality of semiconductor memory chips comprises:

an address counting unit configured to count a predetermined address range when a refresh command signal is applied to output a plurality of refresh address signals corresponding to values obtained by counting the address range, and configured to output a counting flag signal which is toggled when the address range is started; and a refresh control unit that activates a plurality of bank selection signals in response to the refresh command signal, each of the plurality of bank selection signals being assigned to one of a plurality of bank groups;

wherein the refresh control unit is configured to activate the plurality of bank selection signals when a refresh cycle selection signal is deactivated, and a part of the plurality of bank selection signals when the refresh cycle selection signal is activated, wherein the part of the plurality of bank selection signals belong to one of the plurality of bank groups, wherein the refresh control unit comprises:

a first control pulse output group configured to output a plurality of first control pulse signals which are selectively activated in response to the refresh command signal, the refresh cycle selection signal, and the counting flag signal;

a second control pulse output group configured to output a plurality of second control pulse signals which are selectively activated in response to the refresh command signal, the refresh cycle selection signal, and an inversion signal of the counting flag signal; and a pulse output section configured to output the plurality of bank selection signals, which are activated corresponding to activation time points of the plurality of first and second control pulse signals, and the refresh pulse signal in response to a power up signal and a pulse control signal.

14. The semiconductor memory apparatus according to claim 13, wherein, when the refresh cycle selection signal is activated, a period in which the refresh command signal is applied is further is shortened in comparison to a case where the refresh cycle selection signal has been deactivated.

15. The semiconductor memory apparatus according to claim 13, further comprising an address selection unit that outputs the plurality of refresh address signals or a plurality of address signals, which are externally applied, as output addresses in response to an active pulse signal and a refresh pulse signal.

16. The semiconductor memory apparatus according to claim 13, wherein the address counting unit includes a plurality of 1-bit counters which are serially connected to one another and initialized under the control of a power up signal, and output the counting flag signal with a level corresponding to a counting value of the least significant 1-bit counter of the plurality of 1-bit counters.

17. The semiconductor memory apparatus according to claim 13, wherein the refresh pulse signal is activated at the activation time point of one of the plurality of first and second control pulse signals.

18. The semiconductor memory apparatus according to claim 17, wherein the plurality of bank selection signals and the refresh pulse signal are deactivated at an activation time point of the pulse control signal.

* * * * *